United States Patent [19]
Pollock et al.

[11] Patent Number: 5,421,889
[45] Date of Patent: Jun. 6, 1995

[54] METHOD AND APPARATUS FOR INVERTING SAMPLES IN A PROCESS

[75] Inventors: John D. Pollock, Rowley; Louise S. Barriss, North Reading, both of Mass.

[73] Assignee: Tokyo Electron Limited, Tokyo, Japan

[21] Appl. No.: 84,415

[22] Filed: Jun. 29, 1993

[51] Int. Cl.⁶ .............. B25J 3/02; B25J 3/04; B25J 15/00; C23C 16/00
[52] U.S. Cl. .............. 118/719; 118/723 E; 118/731; 118/728; 204/298.15; 414/935; 414/940; 414/941
[58] Field of Search .............. 414/935–941; 118/731, 728, 723 R, 723 VE, 723 E, 719; 198/400, 402, 403; 204/298.15

[56] References Cited

U.S. PATENT DOCUMENTS

| | | | |
|---|---|---|---|
| 3,962,988 | 6/1976 | Murayama | 118/49.1 |
| 4,006,340 | 2/1977 | Gorinas | 219/121 |
| 4,573,863 | 4/1986 | Picotte | 414/763 |
| 4,778,332 | 10/1988 | Byers | 414/735 |
| 4,881,863 | 11/1989 | Braginsky | 414/225 |
| 4,904,153 | 2/1990 | Iwasawa | 414/735 |
| 4,917,556 | 4/1990 | Stark | 414/217 |
| 4,951,604 | 8/1990 | Temple | 118/723 |
| 5,105,147 | 4/1992 | Karasikov | 324/158 F |
| 5,121,531 | 6/1992 | Severns | 29/25.01 |
| 5,205,919 | 4/1993 | Zejda | 204/298.25 |
| 5,226,758 | 7/1993 | Tanaka | 406/86 |
| 5,295,777 | 4/1994 | Hodos | 414/217 |

Primary Examiner—R. Bruce Breneman
Assistant Examiner—Jeffrie R. Lund
Attorney, Agent, or Firm—Lahive & Cockfield

[57] ABSTRACT

The invention provides apparatus and methods for improving systems which expose samples to reactive plasmas, and more particularly for inverting the sample within these systems. The systems are of the type which have one or more process chambers, at least one intermediate chamber, and a robot transport mechanism to transport the sample between the several chambers. The invention includes flipping and gripping assemblies which mount within the intermediate chamber. These assemblies grasp and remove the sample as transported by the robot mechanism, and invert the sample within the intermediate chamber. The inverted sample is repositioned at the robot mechanism so that the sample can be transported to one or more process chambers for deposition in a "face down" orientation, which reduces contamination.

24 Claims, 10 Drawing Sheets

METHOD AND APPARATUS FOR INVERTING SAMPLES IN A PROCESS

BACKGROUND

This invention relates to apparatus and methods for processing samples, such as wafers or substrates, with a process, such as a process directed towards chemical vapor deposition (CVD) or plasma enhanced chemical vapor deposition (PECVD). In particular, the invention provides apparatus and methods for improving the handling, cleanliness, and exposure of those samples within CVD and PECVD processes.

As used herein, a "sample" generically describes a substrate, such as a glass panel or a silicon wafer, which is suitable for deposition techniques, for example PECVD. The sample has a front side, which is treated to receive one or more coating depositions onto the surface, and has a back side, which is generally used to support and manipulate the sample.

Systems which deposit semiconductor films onto samples are well-known today and are utilized in a range of scientific fields. The semiconductor industry, for example, has developed a number of complex PECVD systems to manufacture devices such as thin film transistors (TFTs), liquid crystal displays (LCDs), flat panel displays (FPDs), solar cells, photodetectors, and other integrated circuits.

Typically, these systems include one or more evacuated process chambers that are used to expose the sample to reactive plasmas. The chambers include an electrode pair, to create radio-frequency (RF) discharges between the electrodes, and gas outlets, to pass selective gases, such as silane, between the electrodes. Once the gas passes within the RF electric field, it forms a reactive plasma which deposits onto surfaces in contact with the plasma, including the front side of the sample. By controlling the power and the frequency of the RF energy, the electrode spacing, and the exposure-time during which the sample contacts the reactive plasma, a selective thin film is deposited on the sample surface.

Generally, one process chamber is used for one particular coating or thin film deposition. If a sample is to have more than one type of film deposited on its surface, the system typically has more than one process chamber, and has a robot transport mechanism to move the sample between the several evacuated process chambers. Such a system also has an evacuated intermediate chamber, which serves to access the several process chambers and to reduce the amount of unwanted spurious gas or other contaminants which travel between process chambers. For example, once a film is deposited on the sample in a first chamber, it is transported by the robot through the intermediate chamber and to the second process chamber. The second process chamber is then sealed from the intermediate chamber and the additional film is deposited on the sample.

In certain prior systems, the intermediate chamber also conveniently provides an access port to the system. That is, the samples are loaded into the system and individually processed through the intermediate chamber before deposition in the respective process chambers; and finished samples are removed through the intermediate chamber.

One recurring problem in these systems is contamination. During a deposition cycle, non-uniformities in the RF electric field can result in the formation of floating powder-like substances in the plasma which thereafter fall onto the sample, creating defects in the sample's film structure and consequently in its semiconductor characteristics. Furthermore, plasma-generated films tend to form and accumulate on every chamber surface in contact with the reactive plasma. After the process chamber cycles through several deposition operations, the accumulated films often flake apart, producing minute particles that again fall on and contaminate the sample surface.

This is a severe problem; and the known solutions are not cost effective. One practice is simply to reduce the effective manufacturing yield. For example, portions, or even all, of the sample are discarded if it is contaminated or otherwise degraded by the powder or particles. Another known practice is to mechanically clean the process chamber often, so that the unwanted films on the chamber wall do not accumulate to a thickness that can flake off onto the sample. The chamber is typically flushed with a cleansing gas and then opened to clean and remove the accumulated particles. Yet another practice utilizes etching gases. These gases are injected through the process chambers between depositions, to etch the accumulated films on the chamber walls, thereby lengthening the time interval between the more thorough mechanical cleanings.

These practices, however, are wasteful. They reduce production yield, which costs the manufacturer valuable resources in an ever-competitive market. In the manufacture of Flat Panel Displays (FPDs), for example, forty percent of the sales costs are in materials. Thus production yields are important. The loss of even one sample due to contamination reduces revenue significantly.

Cleaning process chambers mechanically is also costly. The system is shut-down during the cleaning procedures, since it cannot effectively continue to deposit films onto samples at the same time; and there is an additional delay to re-evacuate the chamber and to re-qualify the process. Likewise, auto-cleaning techniques, which utilize etching gases, inhibit production yield rates by reducing the throughput of the system. These etching techniques effectively double the time between sample depositions, since etch rates and deposition rates are approximately equal. Thus the speed and effectivity of the production line are handicapped by contamination problems.

It is, accordingly, an object of the invention to provide improvements to CVD and PECVD systems and methods.

Another object of the invention is to provide improvements to systems which expose samples to reactive plasmas, and in particular to improve the production yield for uncontaminated samples.

Yet another object of the invention is to provide PECVD apparatus and methods which reduce the contamination on samples used in semiconductor devices.

Still another object of the invention is to provide improved apparatus and methods for exposing samples to reactive plasma which are relatively low in cost, and reliable in operation.

More particularly, it is an object of the invention to provide improved apparatus and methods for handling samples within a PECVD system.

These and other objects of the invention will be apparent in the description which follows.

SUMMARY OF THE INVENTION

The invention attains the aforementioned objectives by providing methods and apparatus for inverting samples within a process which expose samples to a reactive plasma.

Thus, in one aspect, the invention provides improvements to systems for exposing a sample to reactive plasmas. The systems are of the type having at least one intermediate chamber, one or more process chambers, and a robot transport mechanism to transport the sample between the several chambers.

In one aspect, the improvement comprises a lifter assembly, a gripper assembly, and a flipper assembly. The lifter assembly has an arm member which extends within the intermediate chamber to a location proximal to the robot mechanism. The gripper assembly couples to the arm member and is arranged to selectively engage and alternatively release the sample being transported by the robot mechanism. The flipper assembly also couples to the arm member and selectively rotates the gripper assembly about a first axis, thereby inverting and re-inverting the sample.

In another aspect according to the invention, the improvement comprises an arm member which is selectively moveable within the intermediate chamber between a first location, which is proximal to the robot mechanism, and a second location, which is distal to the robot mechanism.

In other aspects according to the invention, the improvements comprise first, second, and third drive motors to power the respective movements of the lifter, gripper, and flipper assemblies.

In another aspect, the improvement comprises an arm member which is hingedly attached to the wall of the intermediate chamber. The arm member can, therefore, rotate about a second rotation axis formed at its attachment to the wall.

In other aspects, the improvement comprises an arm member that forms a yoke having a pair of parallel spaced members that extend transverse to the second rotation axis. The parallel spaced members are spaced apart to accommodate the sample and to support the sample with engagements at opposed surfaces of the sample.

Preferably, in another aspect, the improvement comprises a lifter means which includes pillow blocks and self-aligning ball bearings. The arm member is mounted to the pillow blocks and between the ball bearings for smooth rotational motion about the second rotation axis.

In a further aspect, the improvement comprises an end effector which is mechanically coupled to the robot mechanism and which secures the sample during transportation within the intermediate chamber. The end effector forms a stop which centers the transported sample and further includes a spring-loaded clamp to bias the transported sample against the stop. The end effector further includes a release actuator which selectively limits the bias applied to the sample by the clamp.

Preferably, and in other aspects, the improvement comprises a release actuator that includes a pneumatic push rod and a linkage assembly, which responds to the push rod. The release actuator alternatively positions the linkage assembly between a first position, which is spaced away from the clamp, and a second position, which is abuttingly coupled to the clamp. The release actuator is arranged to de-couple the clamp from the sample upon a further movement of the end effector, which operates in conjunction with the robot mechanism.

In other aspects, the sample has an exclusion zone, which is a portion of the sample that may come into physical contact with the flipper, gripper and lifter assemblies, and the improvement comprises an end effector which secures the sample exclusively within the exclusion zone.

In a further aspect, the improvement comprises a gripper assembly having a clamp assembly. and actuated pins, which are slideably attached to the arm member along the first axis. The clamp assembly has opposed jaw members which respond to the axial motion of the pins. The jaw members engage the sample in response to a first axial motion, and release the sample in response to a reverse axial motion. Preferably, the jaw members grasp the sample exclusively within the exclusion zone of the sample.

In yet another aspect, the sample has a primary axis which divides the sample between first and second portions, and the improvement comprises a gripper assembly which engages the sample such that the first axis is offset from the primary axis by a preselected dimension. Accordingly, once the sample is inverted and replaced on the end effector, its position is displaced from its pre-inverted position by approximately two times the preselected dimension.

In another aspect, the invention provides improvements to a method for exposing a sample to reactive plasma. The improvement comprises the steps of: (1) providing a system for exposing the sample to a reactive plasma, including at least one intermediate chamber, at least one process chamber, and a robot transport mechanism to transport the sample between the several chambers; (2) providing within the system first means having an arm member that is selectively moveable between a first location proximal to the robot mechanism, and a second location distal from the robot mechanism; (3) providing within the system second means coupled to the first means for engaging and alternatively releasing the sample as transported by the robot; (4) providing within the system third means coupled to the first means for selectively inverting the second means. The improvement provides for the further steps of: (5) moving the arm member to the first location; (6) engaging the sample with the second means; (7) moving the arm member to the second location; (8) inverting the second means by operation of the third means, thereby inverting the sample; (9) moving the arm member to the first location; and (10) releasing the sample from engagement with the second means.

In another aspect, the invention provides improvements to a method for exposing a sample to reactive plasma within a system which includes one or more process chambers, at least one intermediate chamber, and a robot transport mechanism for transporting the sample between the several chambers. The improvement comprises the steps of: (1) providing within the system means for engaging a sample as transported by the robot mechanism within the intermediate chamber, and for removing the transported sample from the robot mechanism; (2) providing within the system means for inverting the sample within the intermediate chamber; (3) providing within the system means for re-positioning the removed sample at the robot mechanism and for disengaging the sample so that the sample may be transported by the robot mechanism. The improvement provides for the further steps of: (4) engaging the sample with the means for engaging the sample and removing the sample from the robot mechanism; (5) moving the engaged sample away from the robot mechanism; (6) inverting the engaged sample with the means for inverting the sample; (7) moving the engaged sample to the robot mechanism; and (8) re-positioning the sample to the robot mechanism and releasing the sample with the means for repositioning the sample.

In another aspect, the improvement comprises the further step of evacuating the intermediate chamber prior to engaging and inverting the sample.

In yet another aspect, the system has an evacuation chamber and the robot mechanism is arranged to transport the sample between the evacuation chamber and the intermediate and process chambers, and the improvement comprises the further steps of: (1) transporting the sample to the evacuation chamber prior to deposition; (2) sealing the evacuation chamber pressurewise from the intermediate chamber; (3) evacuating the evacuation chamber; and (4) transporting the sample to at least one process chamber.

In yet another aspect, the improvement provides for the further steps of: (5) transporting the sample to the evacuation chamber after deposition in the process chamber; (6) filling the evacuation chamber with air; (7) unsealing the evacuation chamber from the intermediate chamber; and (8) transporting the sample to the intermediate chamber where it may be inverted in standard atmosphere.

The advantages of the invention are many. It reduces the amount of contaminants which fall on the sample's front side, thereby improving the productivity of uncontaminated samples. It allows the industry to load samples into the I/O chamber in a "face up" orientation, which is preferred throughout the industry. It also may operate within a vacuum, for example in conjunction with one or more process chambers, or in standard atmosphere, for example in conjunction with the I/O chamber. It further increases the speed by which the robot may transport samples within the intermediate chamber, thereby increasing yield.

These and other advantages and aspects of the invention are evident in the description which follows and in the accompanying drawings.

DESCRIPTION OF ILLUSTRATED EMBODIMENTS

Figure 1:
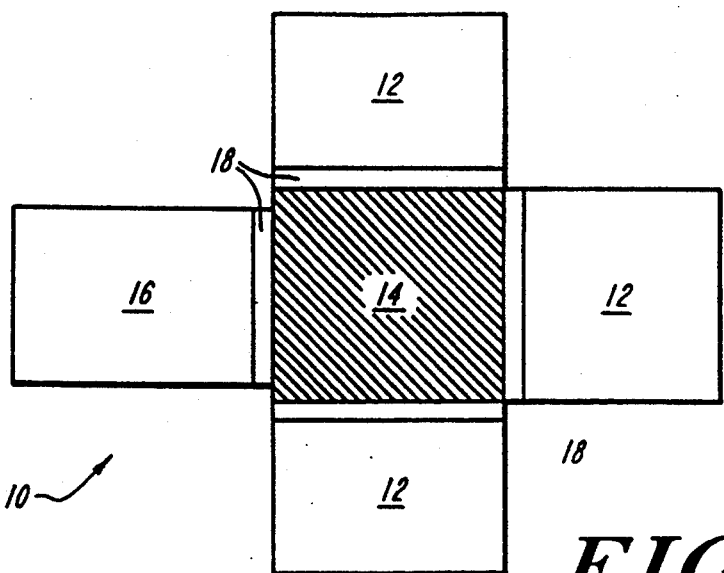
FIG. 1 is a schematic view of a prior art system for exposing samples to reactive plasmas.

FIG. 1 schematically illustrates a prior art system 10 for exposing samples to reactive plasmas. The system includes process chambers 12, an intermediate chamber 14, an Input/Output (I/O) chamber 16, and a robot transport mechanism (not shown) to transport the samples to and between the several chambers 12, 14 and 16. The intermediate chamber 14 has access to each process chamber 12 and to the I/O chamber 16 via isolation valves 18, which hermetically seal the several chambers from one another.

Each process chamber 12 is evacuated and includes a pair of opposed RF electrodes and a gas inlet and outlet. Reactive plasma forms when a gas, such as silane, is injected into the chamber 12 and between active electrodes which discharge radio frequency energy. The sample is held in contact with one electrode with its front side facing the plasma until a desired film, for example a semiconductor thin film, is deposited on the sample's front side. Generally, each process chamber 12 is arranged to generate a different plasma, such that the sample acquires a plurality of different deposition films by traveling between the several chambers 12.

The intermediate chamber 14 is also evacuated. It holds the sample before and between deposition processes, and isolates the several process chambers 12 from one another and from the I/O chamber 16.

In operation, one or more samples are loaded into the I/O chamber 16, which is accessible to the robot transport mechanism. The chamber 16 is evacuated and the isolation valve 18 between the I/O chamber 16 and the intermediate chamber 14 is opened. One sample is then transported into the intermediate chamber 14. The opened valve 18 is afterwards sealed to isolate the intermediate chamber 14 from the I/O chamber 16. One of the valves 18 between the intermediate chamber 14 and the process chambers 12 is then opened to access a selected deposition process chamber. The sample is moved into the selected process chamber and the opened valve 18 is resealed. Gas is injected to the selected process chamber and the electrodes are activated to form the plasma and hence the film on the sample.

Once a desired film is deposited onto the sample, the RF electrodes are deactivated and any remaining gas is cleared from the process chamber. The respective valve 18 is then opened and the coated sample is transported back into the intermediate chamber 14. The opened valve 18 is afterwards resealed.

If desired, another deposition film is selectively applied onto the sample by similarly transporting the sample to another of the process chambers 12. Alternatively, the sample is transported to the I/O chamber 16, where it can be accessed externally after the chamber 16 is appropriately sealed from the intermediate chamber 14 and re-pressurized to ambient atmospheric conditions.

The apparatus and the operations described in connection with FIG. 1 are predicated upon having a sample with a single physical orientation, which is most generally horizontal by supporting the sample's back side. Deposition in each chamber thus occurs with the sample's front side facing upwards.

This prior sample orientation, however, is problematic. An upward facing sample is subjected to falling particulates within the chambers 12. The particulates include the powder-like substances which form in the reactive plasma, and the flakes produced by prior depositions which accumulate on the chamber wall. The invention described herein avoids these problems by selectively inverting the sample within the system. In particular, apparatus in accordance with the invention inverts the sample within the intermediate chamber, thereby exposing the sample's back side to the falling particulates, rather than the front side, and protecting the sample's front side from the process contaminants subjected to gravity.

Figure 2:
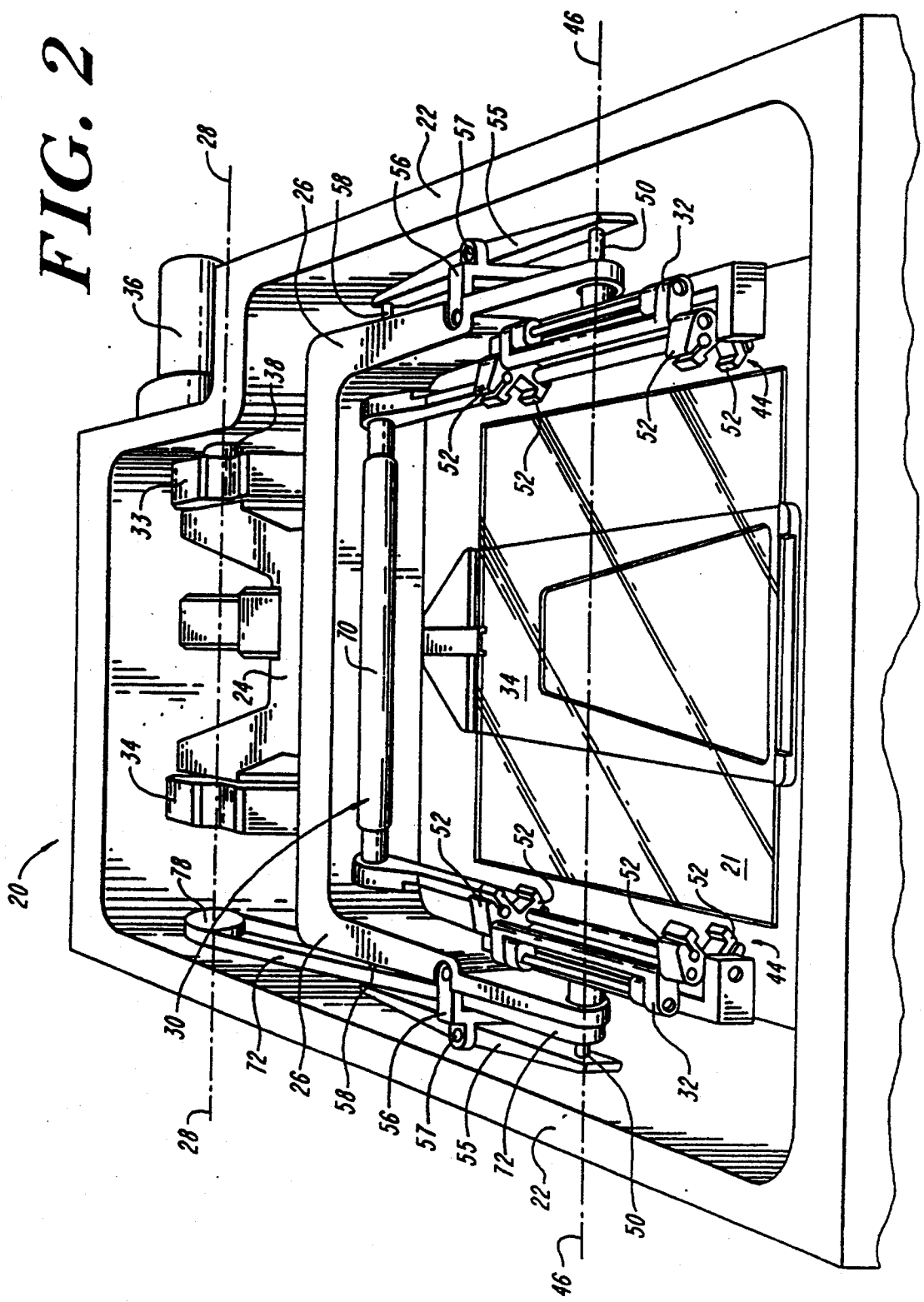
FIG. 2 is a perspective view of an intermediate chamber, partially cut-away, in a system for exposing samples to reactive plasmas, and apparatus in accordance with the invention for inverting those samples within the system.
Figure 3:
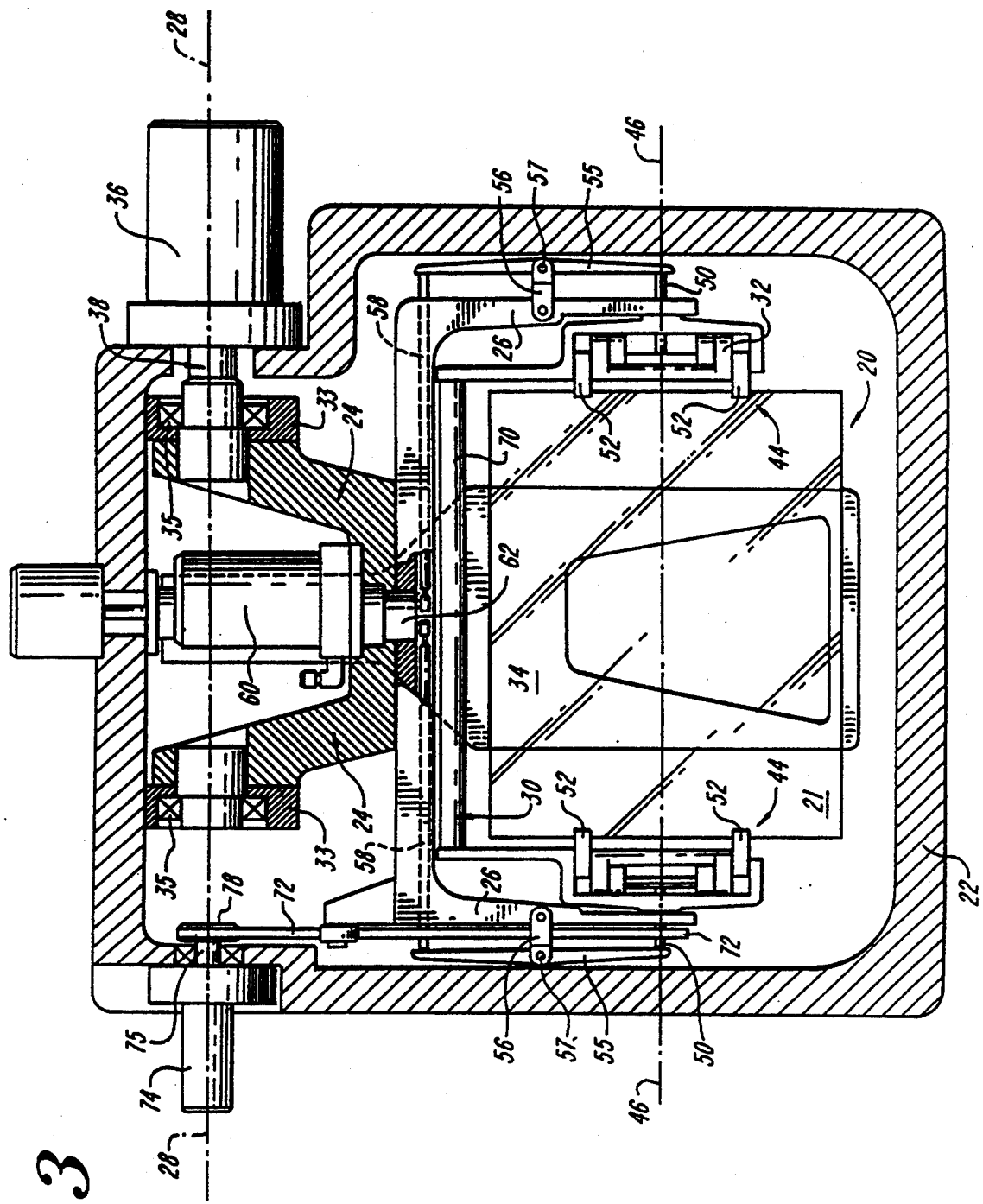
FIG. 3 is in a top-view of the apparatus and chamber illustrated in FIG. 2.

FIGS. 2 and 3 illustrate a multi-axis apparatus 20 in accordance with the invention for inverting a sample 21 within a deposition system, such as an evacuated system illustrated and described in connection with FIG. 1. Inverting the sample within the system is beneficial, in one instance, since it permits film deposition onto the sample's front side in a face-down orientation. Depositing films onto the front side in a downward facing orientation is desirable because it reduces contamination, as described above, and because the technique extends the period between required cleanings, thereby increasing production yields. Inverting the sample within a deposition system is also beneficial, for example, in the manufacture of Flat Panel Displays (FPDs), because it allows a manufacturer or user to load flat glass samples into a PECVD system in the face-up orientation, which is preferred in the long-established convention by which other processing equipment is designed. Effectively, loading samples into a PECVD system in a face-up orientation is cost-effective and compatible with other co-depending industries.

More particularly, with reference to FIGS. 2 and 3, the apparatus 20 preferably mounts to a wall 22 which forms the evacuated intermediate chamber, for example the intermediate chamber 14 of FIG. 1. A lifter assembly 24 hingedly mounts to the wall 22 above the robot transport mechanism and extends a bifurcated arm member 26 transverse to a rotation axis 28. A flipper assembly 30 and a gripper assembly 32 mount to the lifter assembly 24 such that they move in conjunction with the motion of the arm member 26. An end-effector assembly 34 secures and locates the sample 21 within the intermediate chamber and operates in conjunction with the robot transport mechanism and the lifter, flipper, and gripper assemblies 24, 30 and 32.

The end effector 34 increases the processing rate at which samples are transported between respective chambers. Without the end effector, the robot transport mechanism would necessarily move the sample slowly to ensure that the sample does not move relative to the robot mechanism. Unfortunately, materials with a high coefficient of friction which might otherwise alleviate this problem cannot be utilized within a system such as described in FIG. 1 because of the extreme vacuum/temperature conditions within the chambers. Nevertheless, with the end effector of the invention, described below, the sample is held firmly in place within the intermediate chamber such that the robot can increase its speed. Thus, the preferred embodiment of the invention herein described includes the end effector, although it is not required with other features of the invention.

Hinges 33, which hingedly mount the lifter assembly 24 to the chamber wall 22, have a common rotation axis 28. Preferably, pillow blocks and self-aligning ball-bearing 35 form the hinges 33, whereby the lifter assembly 24 is mounted between the bearings 35 for smooth rotational motion of the arm member 26 about the axis 28.

A drive motor 36 has an output shaft 38 aligned concentrically with the rotation axis 28. The motor 36 is preferably coupled to the lifter assembly 24 in the "Oldham" style, which is known in the art. It has a high ratio planetary gearhead at its output and provides the power necessary to directly rotate the lifter assembly 24. The motor 36 mounts to the outside of the wall 22 and is thus exposed to atmospheric pressure. The motor gearhead shaft 38 penetrates the wall 22 and a pair of fluorocarbon seals (not shown) bear against the outside diameter of the shaft 38 to hermetically seal the intermediate chamber from the motor 36.

The lifter assembly 24 is the main support structure of the apparatus 20, supporting both the flipper assembly 30 and the gripper assembly 32. Its bifurcated arm member 26 extends transverse to the rotation axis 28 and forms a rigid yoke which is spaced apart to support the sample 21.

FIGS. 4–12 illustrate additional detail and features of the invention described in connection with FIGS. 1 and 2. Thus, descriptions in connection with FIGS. 4–12 are to be read conjunctively with reference to FIGS. 2–3, rather than independently.

Figure 4:
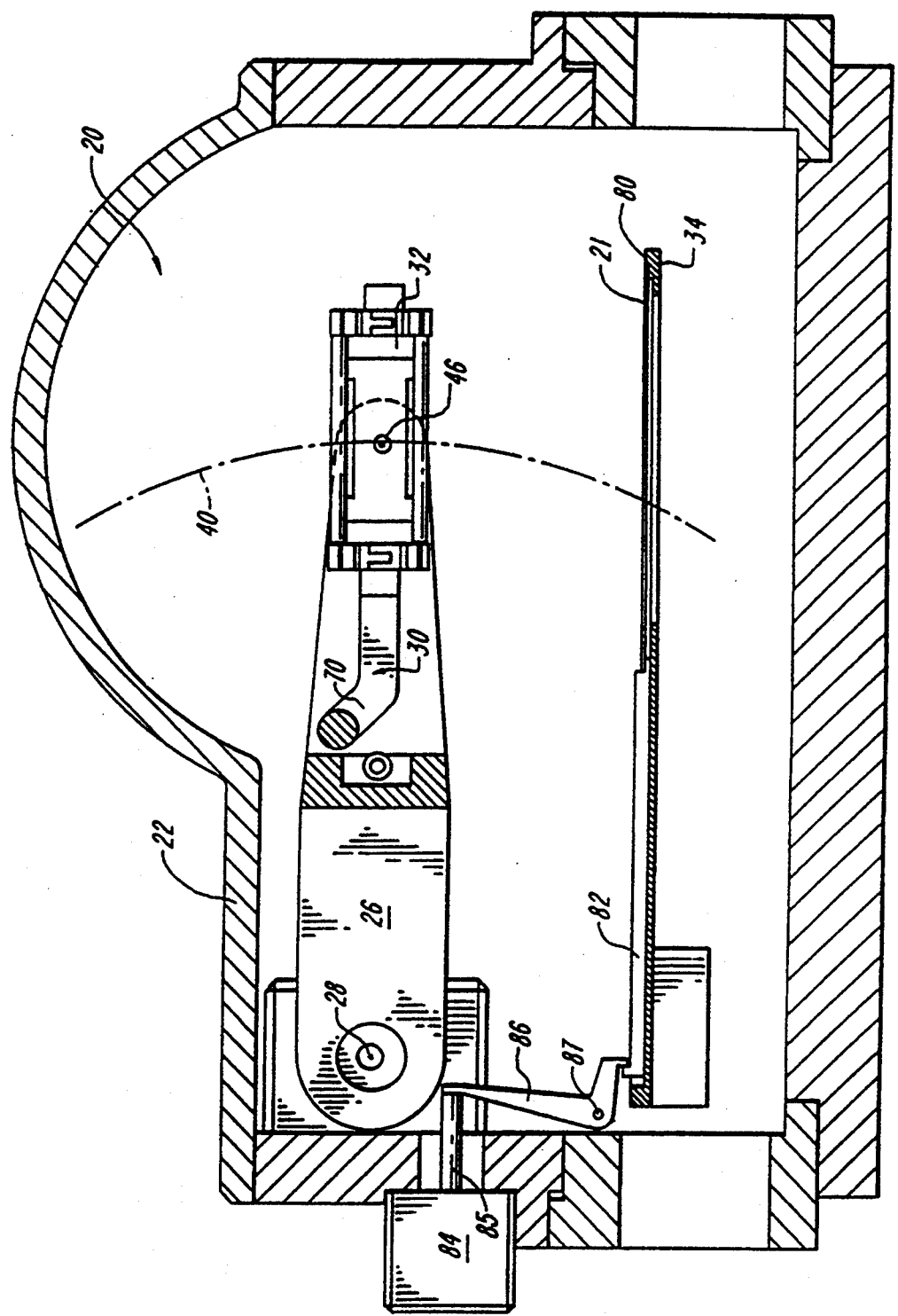
FIG. 4 is an operational cross-sectional view of the apparatus illustrated in FIG. 2 in a first position distal to the robot transport mechanism and prior to engaging the sample.
Figure 5:
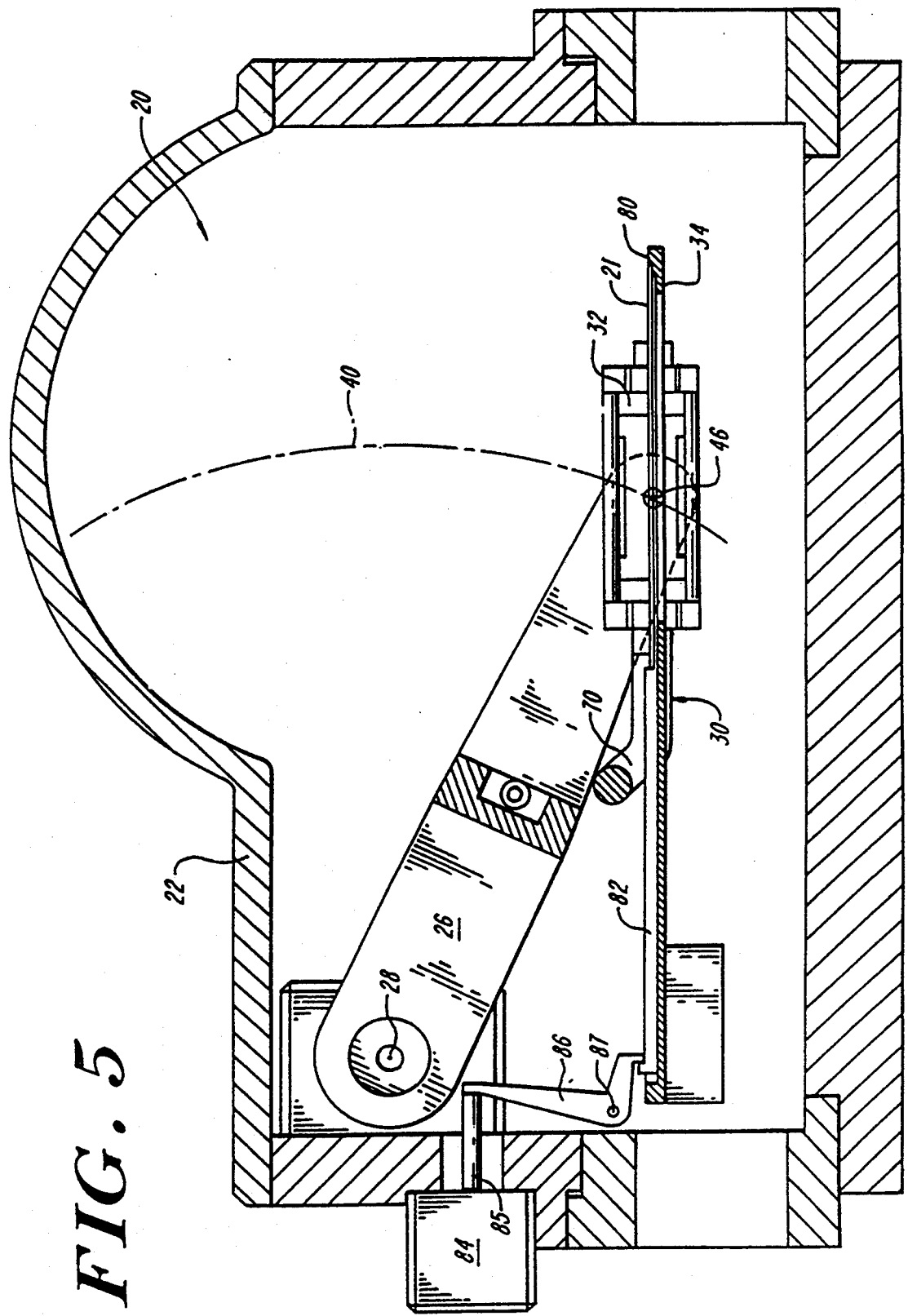
FIG. 5 is an operational cross-sectional view of the apparatus illustrated in FIG. 2 in a second position proximal to the robot transport mechanism and after engaging the sample.
Figure 6:
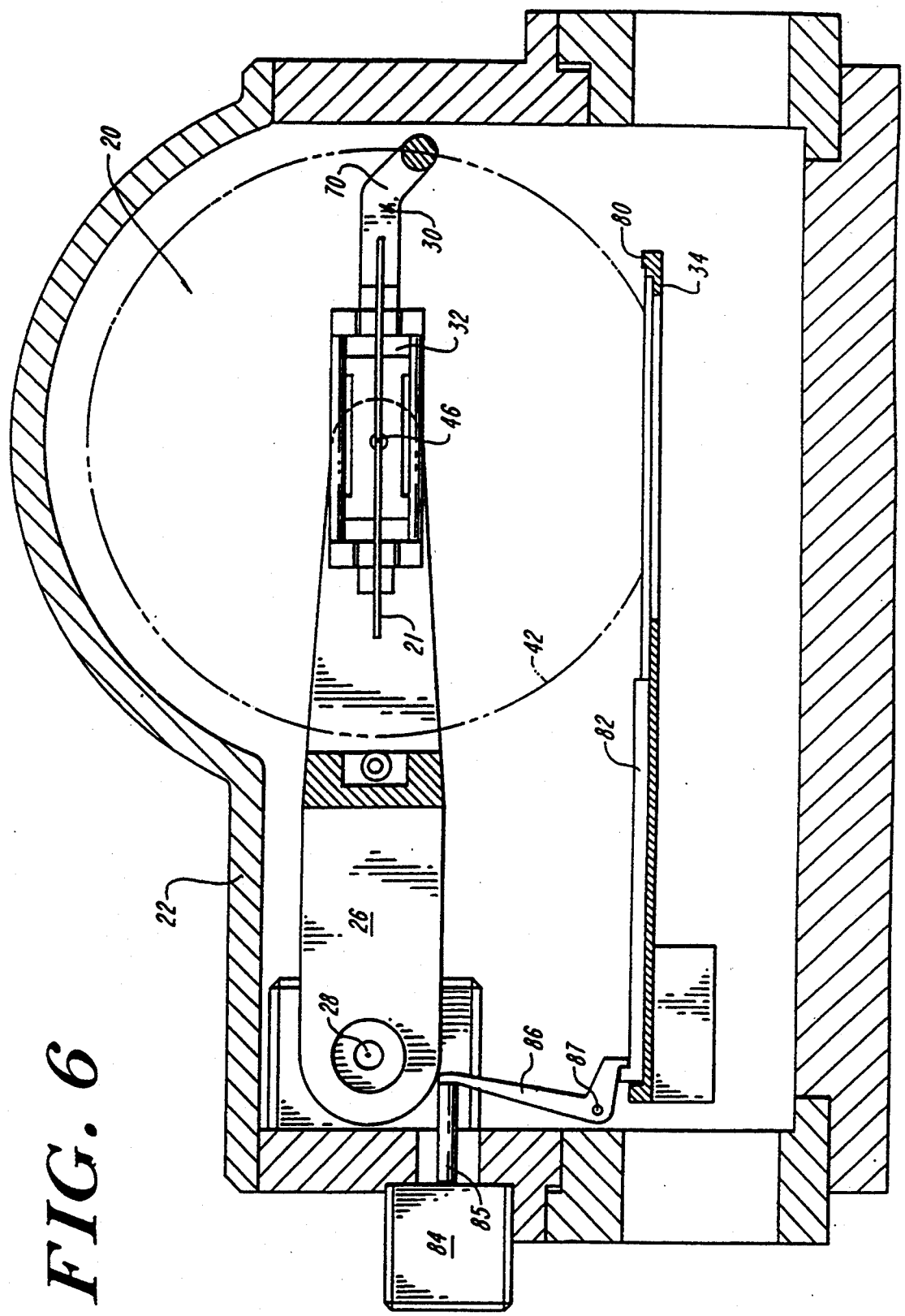
FIG. 6 is an operational cross-sectional view of the apparatus illustrated in FIG. 2 in a first position distal to the robot transport mechanism and after inverting an engaged sample.

As illustrated in FIGS. 4, 5 and 6, the arm member 26 selectively rotates about the rotation axis 28 within the intermediate chamber to interact with the robot transport mechanism, and in particular with the end effector 34. It moves to a position proximal to the end effector 34, as shown in FIG. 5, so that the gripper assembly 32 can engage the sample 21 on the end effector 34. It moves to a position distal to the end effector 34, as shown in FIGS. 4 and 6, so that the flipper assembly 30 can invert the sample 21 without interference from the wall 22 or other components within the intermediate chamber.

FIGS. 4 and 5 additionally illustrate the path 40 along which the arm member 26 travels during rotation FIG. 6 illustrates the path 42 about which the flipper assembly 30 travels when inverting the sample 21 and the gripper assembly 32.

With further reference to FIGS. 2 and 3, the flipper assembly 30 and gripper assembly 32 operate in concert to grasp and invert the sample 21 about a flipper axis 46, which is substantially parallel to the rotation axis 28. The illustrated gripper assembly 32 includes a pair of co-planar and opposed synchronized clamps 44, 44 that are mounted to the bifurcated arm member 26 by crossed roller bearings 48, 48 (see FIG. 9) so that the clamps 44 can freely rotate about the flipper axis 46. The opposed clamps 44, 44 are spaced apart on the yoke formed by the arm member 26 to accommodate the sample 21 therebetween; the spacing is along the axis 46.

Figure 7:
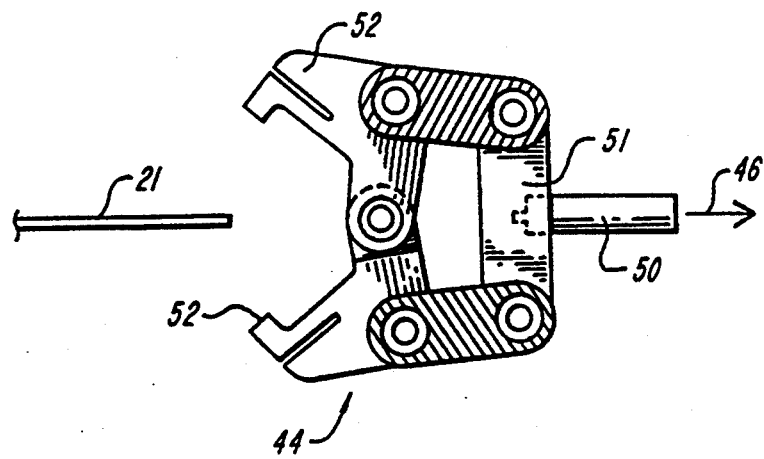
FIG. 7 is an operational cross-sectional view of a clamp constructed in accordance with the invention as part of the gripper assembly illustrated in FIG. 2 and in a release position.
Figure 7A:
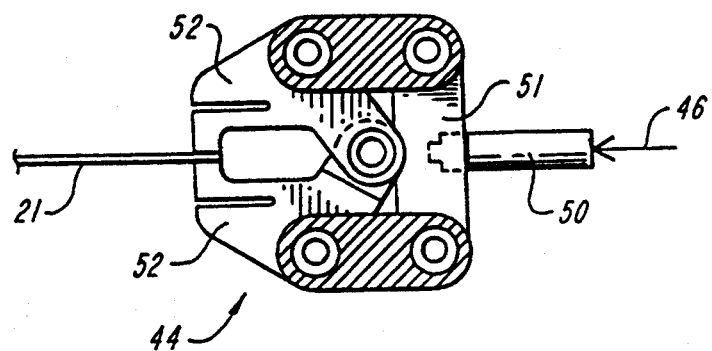
FIG. 7A is an operational cross-sectional view of a clamp constructed in accordance with the invention as part of the gripper assembly illustrated in FIG. 2 and in an engage position.

FIGS. 7 and 7A further illustrate the clamps 44, 44 which are used to selectively engage and alternatively release the sample 21, a fragment of which is shown in FIGS. 7 and 7A. The clamps 44, 44 open and close in response to respective axial motions of actuating pins 50, 50 along the flipper axis 46. In particular, FIG. 7 illustrates one clamp 44 in a release position, which results when the associated pin 50 slides along the flipper axis 46 away from the sample 21. FIG. 7A illustrates one clamp 44 in an engage position, which results when the associated pin 50 slides along the flipper axis 46 in a reverse axial motion, i.e., towards the sample 21. The pins 50, 50 slideably extend along the axis 46, via linear bearings (not shown), through the arm member 26 and crossed roller bearings 48, 48.

In FIGS. 7 and 7A, each pin 50 illustratively attaches to the linkage mechanism 51 that joins the clamp's opposed and co-acting jaw members 52. Each of the clamps 44 has four jaw members 52 (see FIG. 2). The jaw members 52 are linkage-type fingers which gently grasp the sample 21, by engaging the opposed front and back sides of the sample, when the clamps 44, 44 close to the engage position.

Figure 8:
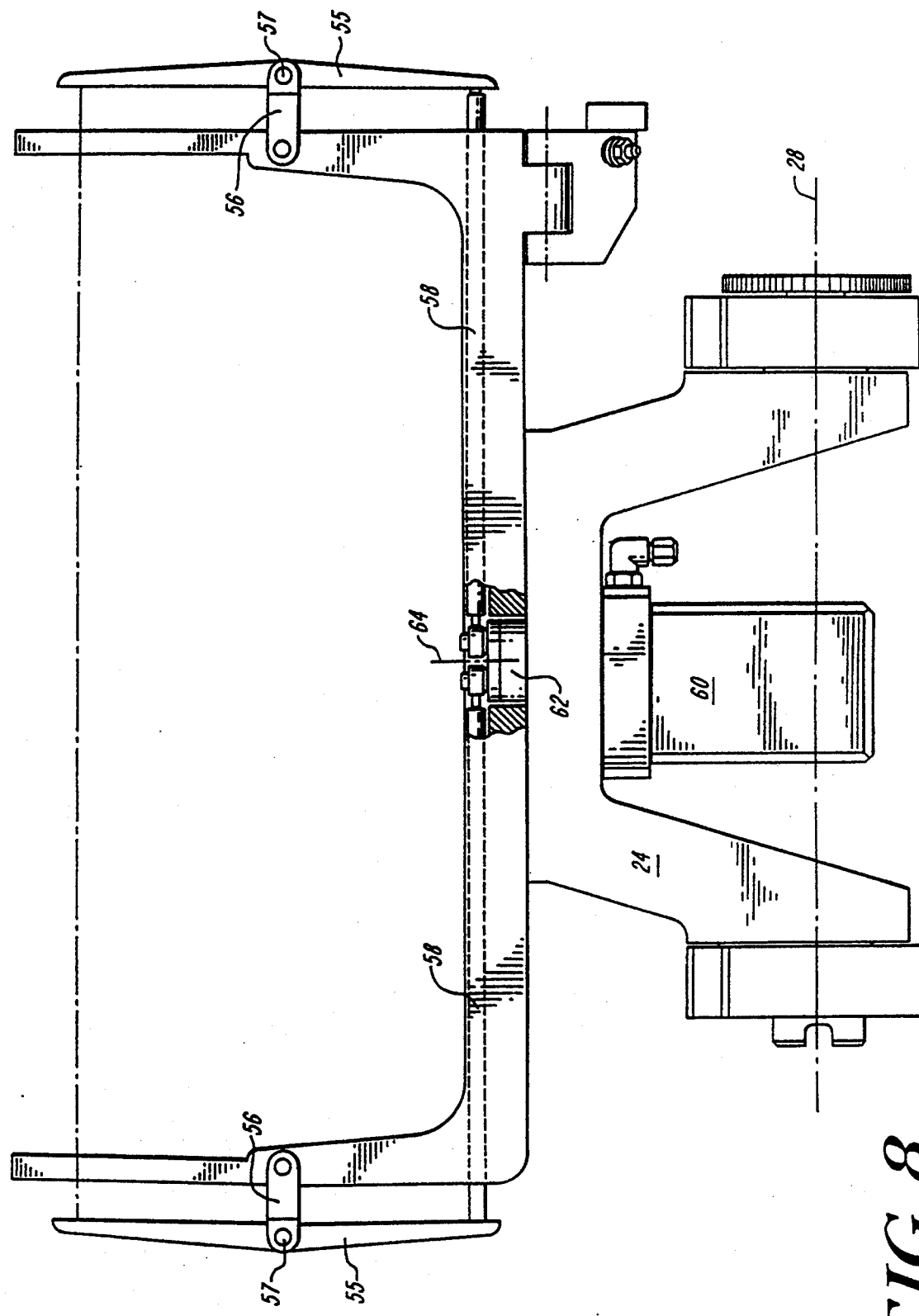
FIG. 8 is a top view of a portion of the lifter assembly illustrated in FIG. 2 and without the complete flipper and gripper assemblies mounted thereto.
Figure 9:
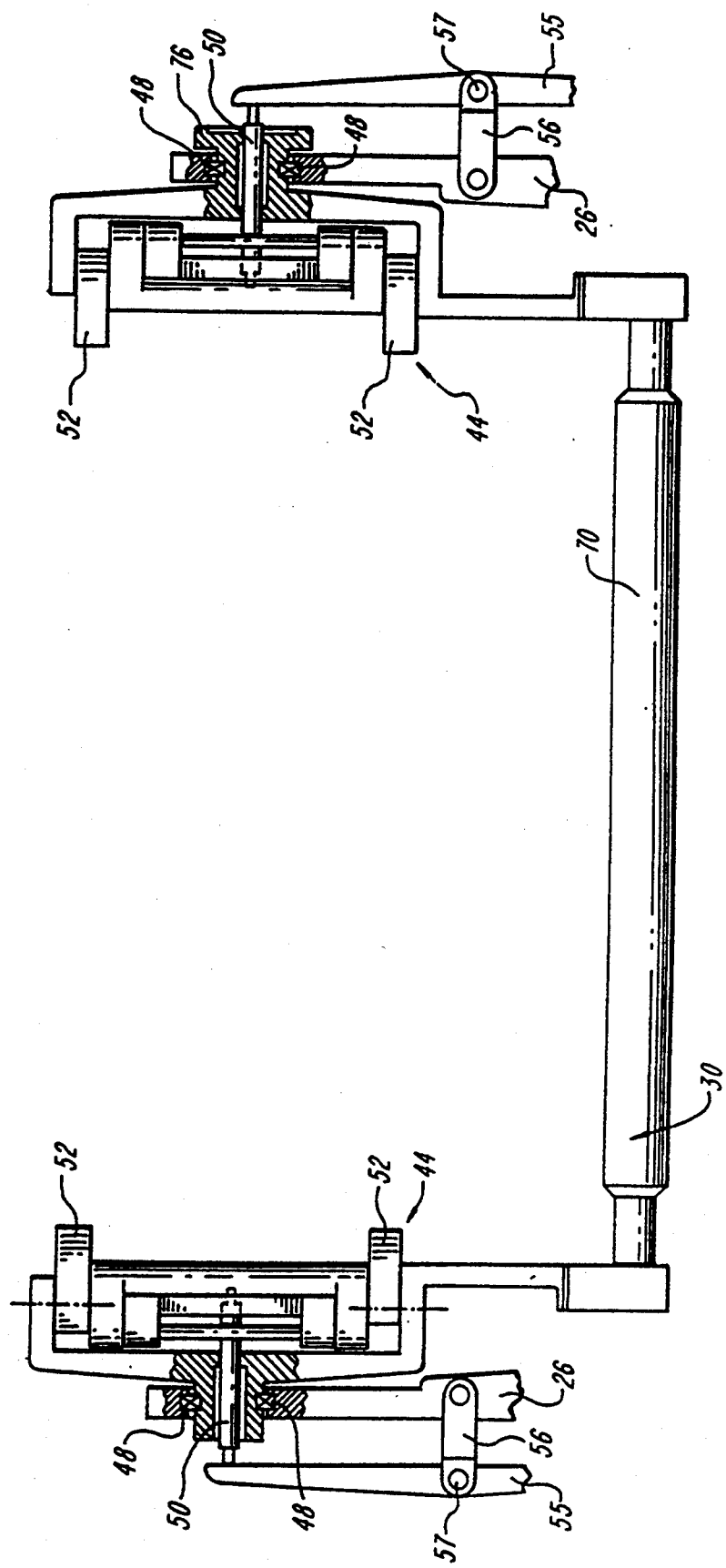
FIG. 9 is a top view of portions of the lifter, gripper, and flipper assemblies illustrated in FIG. 2.

With further reference to FIGS. 2 and 3, and additionally to FIGS. 8 and 9, each of the pins 50 connects to respective rocker arms 55, at one end, via a spherical-type bearing. Each arm 55 pivots about a joint 57 at its mid-span, where it is attached to the arm member 26 by a short link 56. The other ends of the rocker arms 55 connect to respective push rods 58, which extend parallel to the actuating pins 50 and which attach to the gripper drive motor 60 at a common drive member 62.

The motor 60 includes a housing which hermetically isolates the interior motor components, maintained at atmospheric conditions, from the evacuated intermediate chamber. It has an output stage which directly attaches to the common drive member 62. The common drive member 62 is a rigid rotateable disc that acts like a crank when rotated about the axis 64, which is substantially perpendicular to the flipper and the rotation axes 46 and 28, respectively.

Rotating the common drive member 62 moves the push rods 56, 56 in and out, causing the rocker arms 55 to pivot about their fulcrum point 57. This action correspondingly moves the gripper actuating pins 50 along the flipper axis 46, illustratively with a seventeen millimeter stroke length, to open or close the gripper clamps 44.

When the lifter assembly 24 is rotated downwards to engage the sample 21 at the end effector 34, for example as illustrated in FIG. 5, the gripper clamps 44 are in the open, or release, position. Additionally, the center axis of the clamps 44, which coincides with the flipper axis 46, is illustratively approximately two millimeters higher than the sample 21 as supported by the end-effector 34. Thus, when the gripper clamps 44 close to engage the sample by actuating the pins 50, the sample 21 is lifted approximately two millimeters off the end-effector 34. This vertical lift off the end effector 34 is important to ensure that the sample 21 does not engage other structure of the end-effector 34, as described below, during the upward rotation of the lifter assembly 24. The vertical lift off the end effector 34 also ensures that the engaged sample 21 does not push down against the end-effector 34 when the inverted sample is returned to the end effector 34.

The gripper assembly 32, and hence the engaged sample 21, are rotated about the flipper axis 46 by operation of the flipper assembly 30, as illustrated in FIG. 6. For example, the flipper assembly 30 rotates the gripper assembly 180° to invert the engaged sample 21. In addition to inverting the sample, the flipper assembly 30 ensures that the gripper assembly 32 remains substantially horizontal when the lifter assembly 24 and the associated arm member 26 rotate within the intermediate chamber. Even though the arm member 26 rotates through approximately thirty degrees, i.e. from the lower rotation position shown in FIG. 5 to a horizontal position as shown in FIG. 6, the flipper assembly 30 correspondingly rotates the gripper assembly 32 about the flipper axis 46 to offset this rotation to keep the assembly 32 level. The gripper clamps 44 can thus effectively engage the sample 21, which is also level on the end effector 34.

The flipper assembly 30 includes a rigid slave linkage member 70, a metal drive belt 72, and a flipper drive motor 74. The slave member 70 couples the pair of opposed clamps 44, 44 together. The metal drive belt 72 connects to one of the clamps 44 (called the "master" clamp) and to the flipper drive motor 74, and operates to rotate the master clamp about the flipper axis 46. By rotating the master clamp, the other one of the clamps 44 also rotates, via the slave member 70.

The flipper drive motor 74 and its associated shaft 75 mount and penetrate the chamber wall 22 much like the lifter drive motor 36 and shaft 38, as described above.

Figure 10:
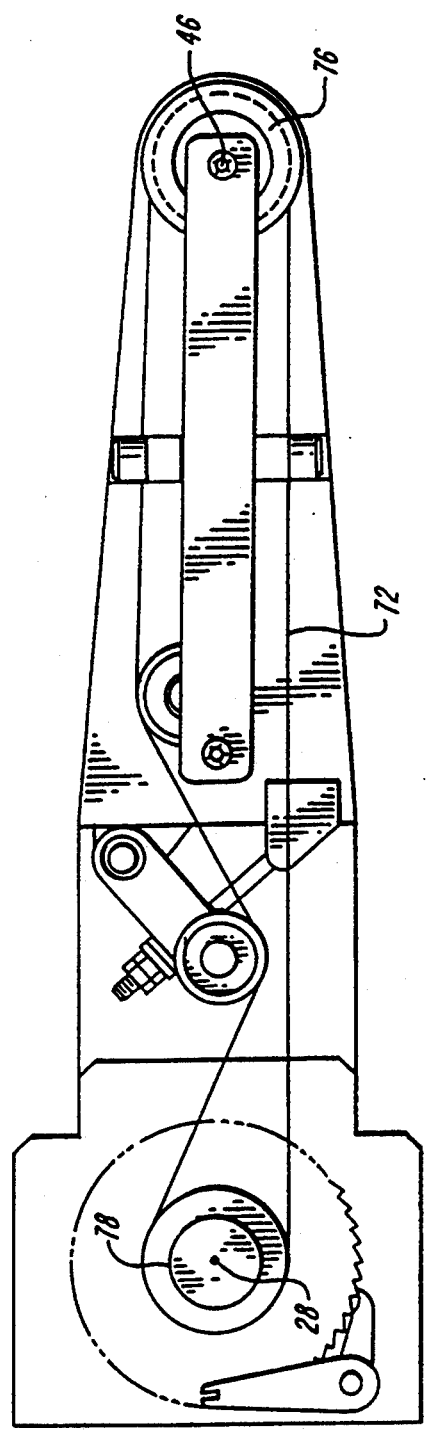
FIG. 10 is a cross-sectional view of a flipper drive assembly constructed in accordance with the invention.

FIG. 10 illustrates the metal drive belt 72 and its preferred connection to the flipper drive motor 74. The metal drive belt 72 couples to a pulley 76 on the gripper assembly 32 and to a pulley 78 of the same diameter on the output shaft of the flipper drive motor 74. The pulley 76 is concentric with the flipper axis 46, and the pulley 78 is concentric with the rotation axis 28. This configuration ensures that there is constant tension on the belt 72 and that the horizontal orientation of the gripper assembly 32 is maintained during rotation of the lifter assembly 24.

After the sample 21 is inverted 180° within the intermediate chamber, the lifter assembly 32 rotates downwards to a position proximal to the end effector 34 to return the sample 21 to the robot transport mechanism. The gripper clamps 44 are opened to gently lower the sample 21, illustratively a distance of approximately two millimeters onto the end-effector 34.

The end-effector 34 operates integrally with the robot transport mechanism. It supports a heated, rectangular shaped sample with engagements at the perimeter of two opposed downward facing surfaces, and locates the sample to the flipper axis 46 within the intermediate chamber.

With reference to FIGS. 4–6, the end effector 34 has a stop 80, a spring-loaded clamp 82, and a release actuator mechanism, which includes a pneumatic actuator 84, push rod 85, and a release linkage 86. The spring-loaded clamp 82 slides linearly on the in-board end of the end-effector and biases the sample against the fixed stop 80, located at the outboard end of the end-effector, illustratively at a force of approximately 0.75 pounds. The clamp 82 holds the sample against the fixed stop 80, thereby centering and locating the sample 21 on the end-effector 34 and within the intermediate chamber.

The clamp 82 is a passive mechanism which is disengaged from the sample 21 before the sample 21 can be manipulated by the flipper, gripper, and lifter assemblies described above. Accordingly, the push rod 85 and release linkage 86 act in concert with the robot transport mechanism to decouple the clamp 82 from the sample 21. Once the end effector 34 positions a sample under the flipper, gripper and lifter assemblies, the pneumatic actuator 84 extends its associated push rod 85 to rotate the release linkage 86 about a hinge 87 and into a "catch" position, which prevents the clamp 82 from traveling forward with the end-effector 34. The robot transport mechanism then moves forward a small amount to exactly position the sample 21 under the gripper assembly 32. This additional motion disengages the clamp 82 from the sample 21 because the release linkage 86 holds the clamp 82 away from the sample edge. Once the clamp 82 is disengaged from the sample 21, the sample 21 can be engaged and inverted by the lifter, gripper and flipper assemblies.

To re-secure the inverted sample on the end effector 34, the robot transport mechanism moves backwards to release the linkage 86 so that the clamp 82 can bias the sample 21 against the stop 80, thus locating the sample 21 within the end effector 34.

Figure 11:
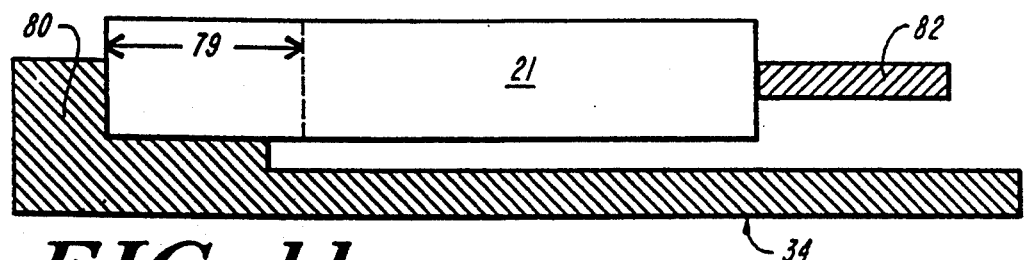
FIG. 11 is an operational cross-sectional view of an end effector, partially cut-away, in accordance with the invention and supporting a sample prior to inverting the sample.
Figure 11A:
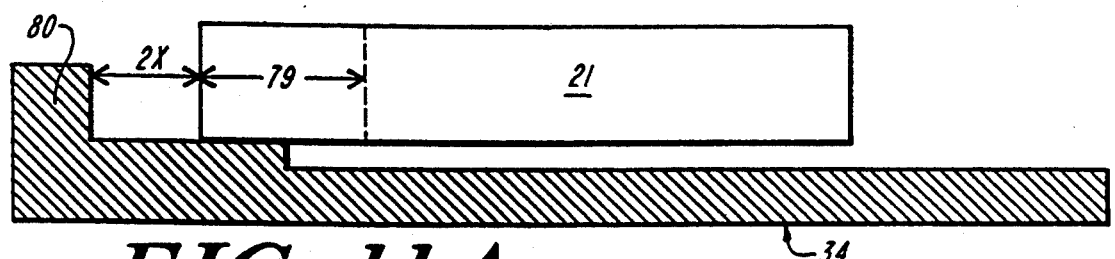
FIG. 11A is an operational cross-sectional view of the end effector illustrated in FIG. 11 and supporting a sample after inverting the sample.

To ensure that an inverted sample is not inadvertently placed on top of, or outside the boundary of, the stop 80, due for example to mechanical tolerances, samples are inverted about an axis having a preselected offset, preferably one millimeter in one illustrative example, from the axis which divides the sample symmetrically. Accordingly, an inverted sample is spaced on the end effector 34 at an offset of two millimeters from its pre-inverted location on the end effector 34. FIGS. 11 and 11A illustrate these actions further.

In FIG. 11, the sample 21 is biased against the stop 80 by the clamp 82 (partially cut-away). By inverting the sample 21 at a preselected dimension of "X" from its symmetry axis, an inverted sample, such as illustrated in FIG. 11A, is replaced on the end effector at a position of "2X" from its pre-inverted position.

FIGS. 11 and 11A also illustrate that the end effector 34 contacts the sample exclusively within an exclusion zone 79, commonly less than ten millimeters wide, at the outer perimeter of the sample 21. This exclusion zone is typically set according to manufacturing requirements to limit the amount of the sample's surface area damaged by physical contact. The jaw members 52 of FIGS. 7 and 7A similarly grasp the sample exclusively within the exclusion zone 79 in cooperation with the same manufacturing requirements.

The invention described herein is beneficial when employed in a variety of systems which expose samples to reactive plasmas, and it is not limited in application to a system 10 such as described in connection with FIG. 1. For example, the invention is particularly useful in a system 88 illustrated in FIG. 12. System 88 includes an I/O chamber 90, an intermediate chamber 92, an evacuation chamber 94, a robot transport mechanism (not shown), and multiple process chambers 96. Apparatus constructed in accordance with the invention, for example the apparatus 20 described in connection with FIGS. 2 and 3, preferably resides within the intermediate chamber 92 and operates in conjunction with the robot transport mechanism.

The system 88 is different from the system 10 of FIG. 1 in that the intermediate chamber 92 is not evacuated. Accordingly, the respective motors for the flipper, gripper, and lifter assemblies are not, necessarily, sealed pressurewise from the intermediate chamber 92. This saves costs because, for example, the fluorocarbon seals and other precautions are not required.

Figure 12:
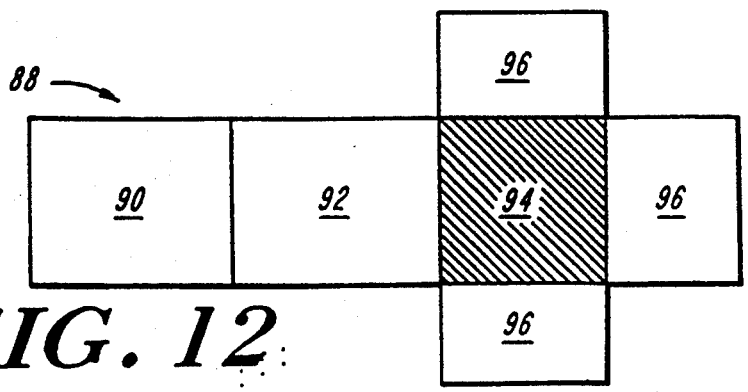
FIG. 12 illustrates a top view of a system for exposing samples to reactive plasmas which benefits from utilizing methods and apparatus according to the invention.

Much like FIG. 1, one or more samples are loaded into the I/O chamber 90 of the FIG. 12 system 88, which is accessible to the robot transport mechanism. One sample is transported to the intermediate chamber 92 where it is inverted. The sample is then transported to the evacuation chamber 94 which is sealed from the intermediate chamber 92 and evacuated. Finally, the sample is transported to one or more process chambers 96 for the desired depositions.

To exit the system 88, the robot moves the sample to the evacuation chamber 94 and the chamber 94 is re-pressurized. The sample is then transported to the intermediate chamber 92, inverted to a "face up" orientation, and moved to the I/O chamber 90, which is accessible externally.

Employing the invention in system 88 is also beneficial for contamination reasons. The powder-like particulates which form in the process chambers 96, and which spread into the evacuation chamber 94, tend to "float" around within the chambers 96 and 94 while the chambers are evacuated. They also tend to quickly fall due to gravity once the chambers are re-pressurized. Accordingly, it is preferred that the sample remain in a "face down" orientation during re-pressurization, to expose only the sample's back side to those residual particulates which fall when the chamber 94 is repressurized. In FIG. 12, the sample is in its "face down" orientation within chamber 94, and is re-inverted to its "face up" orientation only after transportation to the intermediate chamber 92, which is at normal atmosphere.

It is to understood that the apparatus described in connection with FIGS. 2-12 are illustrative rather than limiting, and that additions and modifications will be apparent to those skilled in the art and which fall within the scope of the claims which follow. For example, the flipper, gripper and lifter assemblies can additionally function as a one-panel buffer to improve the handling efficiency and thus the throughput of a PECVD system. That is, those assemblies can hold a sample away from the robot transport mechanism while an additional sample is processed in one or more process chambers in either a "face up" or "face down" orientation, if desired.

In view of the foregoing, what we claim is:

1. In a processing system for exposing a sample to reactive plasma, said system having mechanized robot transport means to transport the sample between one or more process chambers and at least one intermediate chamber which provides access to said process chambers, the improvement comprising
   A. lifter means having an arm member extending within said intermediate chamber proximal to said robot means,
   B. a master clamp for selectively engaging and alternatively releasing the sample being transported by said robot means, C. a second clamp opposed to the master clamp and coupled with said arm member for selectively engaging and alternatively releasing the sample, and D. flipper means coupled with said arm member and with said master clamp for selectively rotating said master clamp about a first axis, thereby for inverting and re-inverting the sample.

2. In a processing system of claim 1, the further improvement wherein said arm member is selectively moveable within said intermediate chamber between a first location proximal to said robot means and a second location distal from said robot means.

3. In a processing system of claim 2, the improvement further comprising first drive means coupled with said lifter means for powering said arm member between said first and second locations.

4. In a processing system of claim 1, the further improvement comprising second drive means coupled with said master clamp for powering said master clamp between a sample-engaging position and a sample-releasing position.

5. In a processing system of claim 1, the further improvement comprising third drive means coupled with said flipper means for powering the rotation of said master clamp about said first axis between inverted and re-inverted positions.

6. In a processing system for exposing a sample to reactive plasma, said system having mechanized robot transport means to transport the sample between one or more process chambers and at least one intermediate chamber which provides access to said process chambers, the improvement comprising A. lifter means having an arm member extending within said intermediate chamber proximal to said robot means, B. gripper means coupled with said arm member for selectively engaging and alternatively releasing the sample being transported by said robot means, C. flipper means coupled with said arm member for selectively rotating said gripper means about a first axis, thereby for inverting and re-inverting said transported sample, and wherein said chamber includes a wall and said arm member is hingedly mounted to said wall, whereby said lifter means rotates said arm member about a second axis which is substantially parallel to said first axis.

7. In a processing system of claim 6, the further improvement wherein said arm member comprises yoke means rigidly attached to said arm member and having a pair of parallel spaced members extending transverse to said second axis and spaced apart to accommodate the sample with engagements at opposed surfaces of the sample.

8. In a processing system of claim 6, the improvement wherein said lifter means further comprises pillow blocks and self-aligning ball bearings for mounting said arm member to said wall and between said ball bearings.

9. In a processing system for exposing a sample to reactive plasma, said system having mechanized robot transport means to transport the sample between one or more process chambers and at least one intermediate chamber which provides access to said process chambers, the improvement comprising A. lifter means having an arm member extending within said intermediate chamber proximal to said robot means, B. gripper means coupled with said arm member for selectively engaging and alternatively releasing the sample being transported by said robot means, C. flipper means coupled with said arm member for selectively rotating said gripper means about a first axis, thereby for inverting and re-inverting said transported sample, D. end effector means mechanically coupled to said robot means for securing the sample during transportation in said intermediate chamber, said end effector means forming a stop for centering said transported sample and having a spring-loaded clamp to bias the transported sample against said stop, and E. release actuator means for selectively limiting the bias applied to the sample by said spring-loaded clamp.

10. In a processing system of claim 9, the further improvement wherein said release actuator means comprises a selectively controlled pneumatic push rod and a first linkage assembly responsive to said push rod, for alternatively positioning said linkage assembly between a first position spaced away from said clamp, and a second position abuttingly coupled to said clamp, said end effector means moving in conjunction with said robot means whereby a movement of said robot means decouples said clamp from the sample.

11. In a processing system of claim 9 wherein the sample has an exclusion zone, said exclusion zone being a portion of the sample which may come into physical contact with said system, the further improvement wherein said end effector means secures the sample exclusively within said exclusion zone.

12. In a processing system for exposing a sample to reactive plasma, said system having mechanized robot transport means to transport the sample between one or more process chambers and at least one intermediate chamber which provides access to said process chambers, the improvement comprising A. lifter means having an arm member extending within said intermediate chamber proximal to said robot means, B. gripper means coupled with said arm member for selectively engaging and alternatively releasing the sample being transported by said robot means, C. flipper means coupled with said arm member for selectively rotating said gripper means about a first axis, thereby for inverting and re-inverting said transported sample, and wherein said gripper means comprises actuated pins and clamp means suspended from said arm member by said actuated pins, said actuated pins being slideably connected to said arm along said first axis, said clamp means having opposed jaws which respond to the axial motion of said pins along said first axis, said jaws engaging the sample in response to a first axial motion of said pins and releasing the sample in response to a reverse axial motion of said pins.

13. In a processing system of claim 12, the further improvement comprising second drive means coupled with said gripper means for actuating said pins in said first and said reverse axial motions, and, thereby, for moving said jaws between engage and release conditions.

14. In a processing system of claim 12, the further improvement comprising rotatable bearings coupled to said arm member, said actuated pins being slideably connected to said rotatable bearings.

15. In a processing system for exposing a sample to reactive plasma, said system having mechanized robot transport means to transport the sample between one or more process chambers and at least one intermediate chamber which provides access to said process chambers, the improvement comprising
  A. lifter means having an arm member extending within said intermediate chamber proximal 19 said robot means,
  B. gripper means coupled with said arm member for selectively engaging and alternatively releasing the sample being transported by said robot means.
  C. flipper means coupled with said arm member for selectively rotating said gripper means about a first axis, thereby for inverting and re-inverting said transported sample, and wherein said lifter means comprises yoke means rigidly attached to said arm member and having bifurcated spaced members extending transverse to said first axis, said gripper means further comprising a pair of opposed clamps, each of said clamps being respectively suspended from and rotatably fixed on one of said spaced members by an associated actuated pin that is slideably attached to said one of said spaced members and along said first axis, and each clamp having associated opposed and coacting jaw members which respond to the axial motion of said associated actuated pin along said first axis, said jaw members engaging the sample in a first axial motion of said pin and releasing the sample in a second reverse axial motion of said pin, said opposed clamps of each pair being spaced apart parallel to said first axis to accommodate the dimension of the sample therebetween, with each of said associated opposed jaw members arranged to engage and release the thickness of the sample therebetween.

16. In a processing system of claim 15, the further improvement wherein said gripper means comprises opposed linkage members and opposed motor members, each of said linkage members being pivotably attached to a respective one of said spaced members and having a first end hingedly affixed to said associated actuated pin and a second end hingedly affixed to a respective one of said motor members, said gripper means further having common drive means hingedly affixed to said motor members to provide concerted engage and release movements of said pair of opposed clamps.

17. In a processing system of claim 16, the further improvement wherein said common drive means comprises a rigid disc and a gripper drive for selectively rotating said disc about a third axis, said motor members being affixed to said disc on respective opposed sides relative to said third axis whereby said motor members and said linkage members move substantially symmetrically about said third axis.

18. In a processing system of claim 15, the further improvement wherein said flipper means comprises
  A. slave linkage rigidly coupling said pair of opposed clamps for concerted motion about said first axis,
  B. a flipper belt coupled to one of said associated pins, and
  C. flipper drive means for selectively rotating said flipper belt and, thereby, rotating said associated pin and said pair of opposed clamps about said first axis.

19. In a processing system of claim 18, the further improvement wherein said flipper means comprises flipper drive means for selectively rotating said flipper belt, thereby rotating said pair of opposed clamps about said flipper axis.

20. In a processing system of claim 15, the further improvement wherein said chamber includes a wall and said arm member is hingedly mounted to said wall for rotating said arm member within said intermediate chamber.

21. In a processing system of claim 15, the further improvement wherein the sample has an exclusion zone, said exclusion zone being a portion of the sample which may come into physical contact with said system, the further improvement wherein said jaw members engage the sample exclusively within said exclusion zone.

22. In a processing system for exposing a sample to reactive plasma, said system having mechanized robot transport means to transport the sample between one or more process chambers and at least one intermediate chamber which provides access to said process chambers, the improvement comprising
  A. lifter means having an arm member extending within said intermediate chamber proximal to said robot means:
  B. gripper means .coupled with said arm member for selectively engaging and alternatively releasing the sample being transported by said robot means
  C. flipper means coupled with said arm member for selectively rotating said gripper means about a first axis, thereby for inverting and re-inverting said transported sample, and wherein the sample has a primary axis dividing the sample into first and second portions, the further improvement wherein said gripper means engages the sample such that said first axis is offset from said primary axis by a preselected dimension, and whereby said inverted sample is spaced at a position of approximately two times the preselected dimension.

23. In a processing system for exposing a sample to reactive plasma, said system having a mechanized robot transport means to transport the sample between one or more process chambers, and having at least one intermediate chamber which includes a wall and provides access to said process chambers, the improvement comprising
  A. lifter means having a rigid yoke hingedly attached to said wall, and further having a lifter drive to selectively rotate said yoke about a rotation axis, said yoke forming bifurcated first and second opposed arms which extend transverse to said rotation axis, the ends of said arms forming a second axis that is substantially parallel to said rotation axis,
  B. gripper means supported by said yoke and having first and second opposed clamps suspended, respectively, by first and second actuated pins, each of said pins being slideably connected axially to a respective one of said arms and along said second axis, and further being rotatable about said second axis, said clamps having jaws which respond to the axial motion of said pins wherein said jaws grasp the sample in a first axial motion and release the sample in a reverse second axial motion, said gripper assembly further having a gripper drive to selectively move said pins in said first and second axial motions, and
  C. flipper means having a support rigidly connecting said clamps and a flipper drive to selectively rotate at least one of said clamps about said second axis, said lifter means being selectively rotatable between a first position in which said clamps grasp and alternatively release the sample as transported by said robot means, and a second position in which the sample is suspended away from said robot means and said flipper drive inverts and alternatively re-invert the sample.

24. In a processing system of claim 23 further comprising bearing means coupled to each of said opposed arms, each of said pins being slideably connected to said bearing means along said second axis, each of said pins further being connected to a respective one of said clamps and rotatable about said second axis in concert with said clamps.

* * * * *